(12) United States Patent
Chouksey et al.

(10) Patent No.: US 11,437,472 B2
(45) Date of Patent: Sep. 6, 2022

(54) INTEGRATED CIRCUIT STRUCTURES HAVING GERMANIUM-BASED CHANNELS

(71) Applicant: Intel Corporation, Santa Clara, CA (US)

(72) Inventors: Siddharth Chouksey, Portland, OR (US); Glenn Glass, Portland, OR (US); Anand Murthy, Portland, OR (US); Harold Kennel, Portland, OR (US); Jack T. Kavalieros, Portland, OR (US); Tahir Ghani, Portland, OR (US); Ashish Agrawal, Hillsboro, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 923 days.

(21) Appl. No.: 16/022,510

(22) Filed: Jun. 28, 2018

(65) Prior Publication Data
US 2020/0006492 A1  Jan. 2, 2020

(51) Int. Cl.
| H01L 31/072 | (2012.01) |
| H01L 31/109 | (2006.01) |
| H01L 29/165 | (2006.01) |
| H01L 21/8234 | (2006.01) |
| H01L 29/06 | (2006.01) |
| H01L 27/088 | (2006.01) |

(52) U.S. Cl.
CPC .... *H01L 29/165* (2013.01); *H01L 21/823431* (2013.01); *H01L 27/0886* (2013.01); *H01L 29/0649* (2013.01)

(58) Field of Classification Search
CPC .......... H01L 29/165; H01L 21/823431; H01L 27/0886; H01L 29/0649; H01L 21/28255; H01L 29/66795; H01L 29/7854; H01L 29/66545
USPC ........................................... 257/192
See application file for complete search history.

(56) References Cited

U.S. PATENT DOCUMENTS

| 2013/0005106 A1* | 1/2013 | Tezuka ................. H01L 27/092 438/299 |
| 2017/0069628 A1* | 3/2017 | Wang ............. H01L 21/823431 |

* cited by examiner

*Primary Examiner* — Theresa T Doan
(74) *Attorney, Agent, or Firm* — Schwabe, Williamson & Wyatt P.C.

(57) ABSTRACT

Embodiments of the disclosure are in the field of advanced integrated circuit structure fabrication and, in particular, integrated circuit structures having germanium-based channels are described. In an example, an integrated circuit structure includes a fin having a lower silicon portion, an intermediate germanium portion on the lower silicon portion, and a silicon germanium portion on the intermediate germanium portion. An isolation structure is along sidewalls of the lower silicon portion of the fin. A gate stack is over a top of and along sidewalls of an upper portion of the fin and on a top surface of the isolation structure. A first source or drain structure is at a first side of the gate stack. A second source or drain structure is at a second side of the gate stack.

20 Claims, 12 Drawing Sheets

INTEGRATED CIRCUIT STRUCTURES HAVING GERMANIUM-BASED CHANNELS

TECHNICAL FIELD

Embodiments of the disclosure are in the field of advanced integrated circuit structure fabrication and, in particular, 10 nanometer node and smaller integrated circuit structure fabrication and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
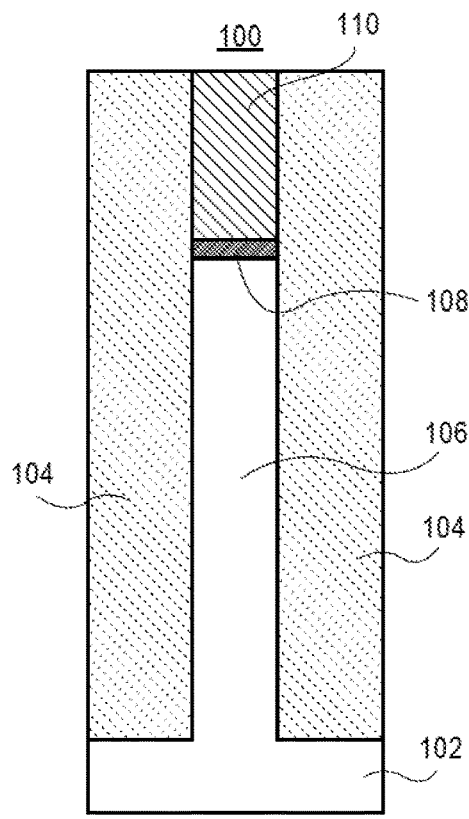
FIG. 1 illustrates a cross-sectional view of a semiconductor fin formed in trench of an isolation structure on a substrate, in accordance with an embodiment of the present disclosure.

Integrated circuit structures having germanium-based channels are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with one or more embodiments of the present disclosure, silicon germanium ($Si_{1-x}Ge_x$) metal oxide semiconductor (MOS) transistors with nucleation layers and germanium (Ge) MOS transistors with virtual substrates are described.

To provide context, $Si_{1-x}Ge_x$ or Ge growth directly on silicon (Si) substrate forms defects in the film which can negatively impact transistor performance. $Si_{1-x}Ge_x$ or Ge growth directly on a silicon substrate in an aspect ratio trapping (ART) trench can assist with reduction in defects but does not necessarily solve defect issues. The quality of the grown may still be inadequate due to lattice mismatch.

In an embodiment, a germanium (Ge) nucleation layer is first grown on a silicon portion in an ART trench. In one embodiment, the Ge nucleation layer partially relaxes by trapping defects within itself. The relaxed Ge nucleation layer may lattice match to a lattice constant of a next grown $Si_{1-x}Ge_x$ layer to yield defect-free or essentially defect-free growth. The $Si_{1-x}Ge_x$ layer can be used as a device layer or used as a virtual substrate on which a Ge device layer is then grown. Advantages of implementing embodiments described herein may include improved device layer film quality leading to improved transistor performance by increasing carrier mobility.

One or more embodiments described herein are directed to implementations of aspect ratio trapping of non-lattice-matched materials on silicon for device fabrication, such as for metal oxide semiconductor field effect transistor (MOSFET) fabrication. One or more embodiments may be applicable for high performance, low leakage logic complementary metal oxide semiconductor (CMOS) devices. In one embodiment, aspect ratio trapping is used to achieve defect reduction in the semiconductor materials used to fabricate integrated circuit structures.

One or more embodiments described herein involve implementation of aspect ratio trapping (ART) by forming openings or trenches in an insulating layer formed on a silicon substrate (or other) surface. Non-latticed matched materials for are then grown directly on portions of the substrate exposed by the openings. In an embodiment, an isolation layer is first formed over a substrate and planarized. The isolation layer may be referred to as a shallow trench isolation (STI) layer since it can ultimately be used to isolate neighboring devices from one another. Such an STI layer may be formed by a deposition and chemical mechanical polishing (CMP) process. Openings are then formed in the isolation layer, e.g., by a lithography and etch process. The openings expose portions of the uppermost surface of the underlying substrate. A stack of semiconductor materials is then formed in the openings.

In a particular embodiment implementing an ART approach, in accordance with an embodiment of the present disclosure, a method of fabricating an integrated circuit structure includes forming a trench in an isolation structure on a silicon substrate, the trench exposing a portion of the silicon substrate. A lower silicon portion of a fin is then formed in the trench and on the exposed portion of the silicon. An intermediate germanium portion of the fin is formed in the trench and on the lower silicon portion of the fin. In an embodiment, the intermediate germanium portion of the fin traps lattice defects of the fin.

A silicon germanium portion of the fin is formed in the trench and on the intermediate germanium portion of the fin. In one embodiment, an upper germanium portion of the fin is formed in the trench and on the silicon germanium portion of the fin. In another embodiment, such an upper germanium portion is not formed. In either case, in an embodiment, the isolation structure is the recessed to expose sidewalls of a portion of the fin. A gate stack is then formed on and along the exposed sidewalls of the portion of the fin.

As used throughout, the term silicon, e.g., as used in silicon substrate or in silicon fin portion, may be used to describe a silicon material composed of a very substantial amount of, if not all, silicon. However, it is to be understood that, practically, 100% pure Si may be difficult to form and, hence, could include a tiny percentage of impurity dopants (such as boron, phosphorous or arsenic) and/or could include a tiny percentage of carbon or germanium. Such impurities may be included as an unavoidable impurity or component during deposition of Si or may "contaminate" the Si upon diffusion during post deposition processing.

As used throughout, the term germanium, e.g., as used in germanium nucleation layer or germanium device layer or germanium channel structure, may be used to describe a germanium material composed of a very substantial amount of, if not all, germanium. However, it is to be understood that, practically, 100% pure Ge may be difficult to form and, hence, could include a tiny percentage of impurity dopants (such as boron, phosphorous or arsenic) and/or could include a tiny percentage of silicon or carbon. Such impurities may be included as an unavoidable impurity or component during deposition of Ge or may "contaminate" the Ge upon diffusion during post deposition processing. As such, embodiments described herein directed to a germanium nucleation layer or germanium device layer or germanium channel structure may include a germanium nucleation layer or germanium device layer or germanium channel structure that contains a relatively small amount, e.g., "impurity" level, non-Ge atoms or species, such as Si.

As used throughout, the term silicon germanium, e.g., as used in silicon germanium device layer or silicon germanium channel structure, may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 70% germanium and approximately 30% silicon ($Si_{30}Ge_{70}$.) It is to be understood that, practically, 100% pure silicon germanium (referred to generally as SiGe) may be difficult to form and, hence, could include a tiny percentage of impurity dopants (such as boron, phosphorous or arsenic) and/or could include a tiny percentage of carbon. Such impurities may be included as an unavoidable impurity or component during deposition of SiGe or may "contaminate" the SiGe upon diffusion during post deposition processing. As such, embodiments described herein directed to a silicon germanium device layer or silicon germanium channel structure may include a silicon germanium device layer or silicon germanium channel structure that contains a relatively small amount, e.g., "impurity" level, non-Ge atoms or species.

Figure 2A:
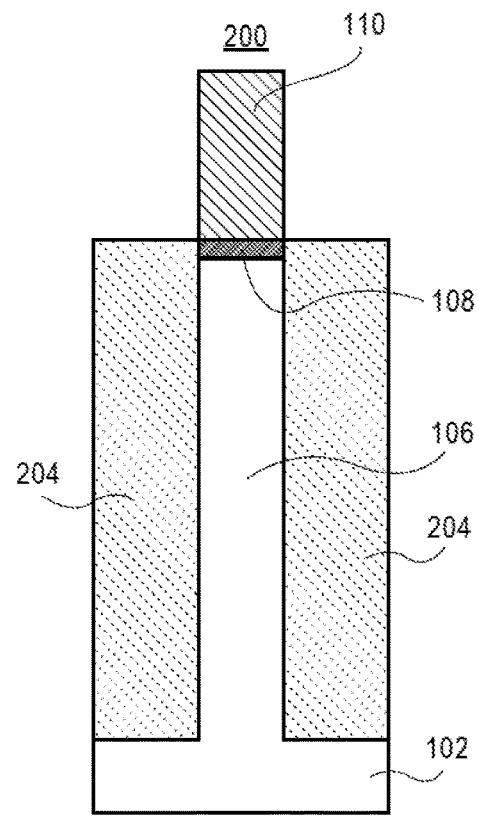
FIGS. 2A-2C illustrates cross-sectional views of the semiconductor fin with various extents of recessing of the isolation structure of FIG. 1, in accordance with an embodiment of the present disclosure.
Figure 2B:
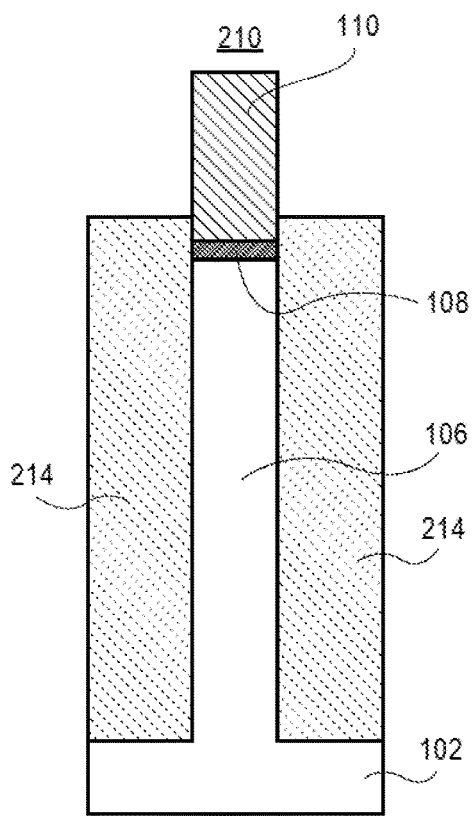
Figure 2C:
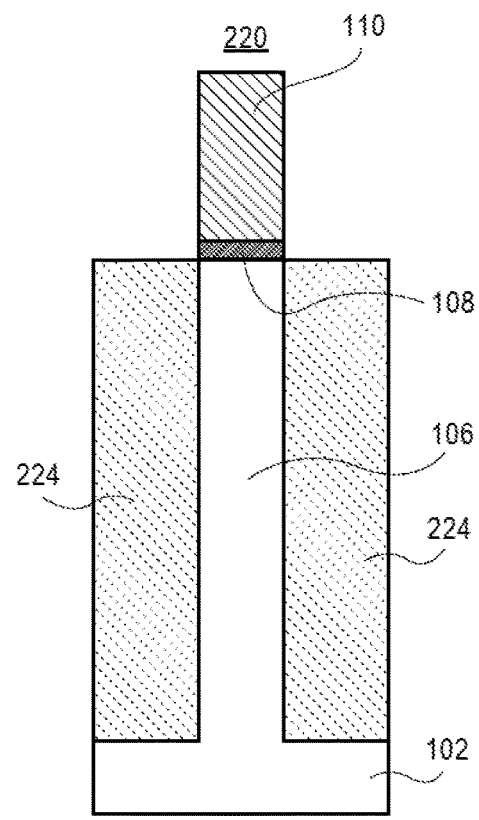

In an example involving fabrication of a $Si_{1-x}Ge_x$ device or channel layer on a germanium nucleation layer, FIG. 1 illustrates a cross-sectional view of a semiconductor fin formed in trench of an isolation structure on a substrate, in accordance with an embodiment of the present disclosure. FIGS. 2A-2C illustrates cross-sectional views of the semiconductor fin with various extents of recessing of the isolation structure of FIG. 1, in accordance with an embodiment of the present disclosure.

Referring to FIG. 1, a starting structure 100 includes an ART isolation structure 104 formed on a silicon substrate 102 and has an opening exposing a portion of the silicon substrate 102. A fin is formed in the opening, e.g., by epitaxial growth, the fin having a lower silicon portion 106, an intermediate germanium portion 108 on the lower silicon portion 106, and an upper silicon germanium portion 110 on the intermediate germanium portion 108.

Referring to FIGS. 2A-2C, the ART isolation structure 104 is then recessed to form an isolation structure along sidewalls of the lower silicon portion 106 of the fin. In an embodiment, as shown for structure 200 in FIG. 2A, the top surface of the isolation structure 204 is co-planar with a top surface of the intermediate germanium portion 108 of the fin. In another embodiment, as shown for structure 210 in FIG. 2B, the top surface of the isolation structure 214 is above a top surface of the intermediate germanium portion 108 of the fin. In another embodiment, as shown for structure 220 in FIG. 2C, the top surface of the isolation structure 224 is co-planar with a bottom surface of the intermediate germanium portion 108 of the fin. In another embodiment, not shown, the top surface of the isolation structure is between the top and bottom surfaces of the intermediate germanium portion 108 of the fin. In another embodiment, not shown, the top surface of the isolation structure is below a bottom surface of the intermediate germanium portion 108 of the fin. In the last such case, the intermediate germanium portion 308 of the fin may be accessible for optional removal during a replacement gate process flow to enable fabrication of a gate all around device.

In an embodiment, the intermediate germanium portion 108 of the fin has a lattice constant approximately the same as a lattice constant of the upper silicon germanium portion 110 of the fin. In an embodiment, the intermediate germanium portion 108 of the fin is partially relaxed and has trapped defects therein. In an embodiment, the upper silicon germanium portion 110 of the fin includes $Si_{30}Ge_{70}$.

In an embodiment, as is described in greater detail below and as exemplified in FIGS. 5A-5E, 6A and 6B, a gate stack is formed over a top of and along sidewalls of the upper silicon germanium portion 110 of the fin and on a top surface of the isolation structure (such as isolation structure 204, 214 or 224). It is to be appreciated that the gate stack is formed along the sidewalls of the portion of the fin exposed by recessing of the isolation structure, which may or may not include some or all of intermediate germanium portion 108 and, possibly some of lower silicon portion 106. The gate stack has a first side opposite a second side. A first source or drain structure is at the first side of the gate stack. A second source or drain structure is at the second side of the gate stack. In an embodiment, the first and second source or drain structures are first and second epitaxial source or drain structures embedded in the fin at the first and second sides of the gate stack, respectively. In another embodiment, the first and second source or drain structures are first and second doped regions formed in the fin at the first and second sides of the gate stack, respectively.

Figure 3:
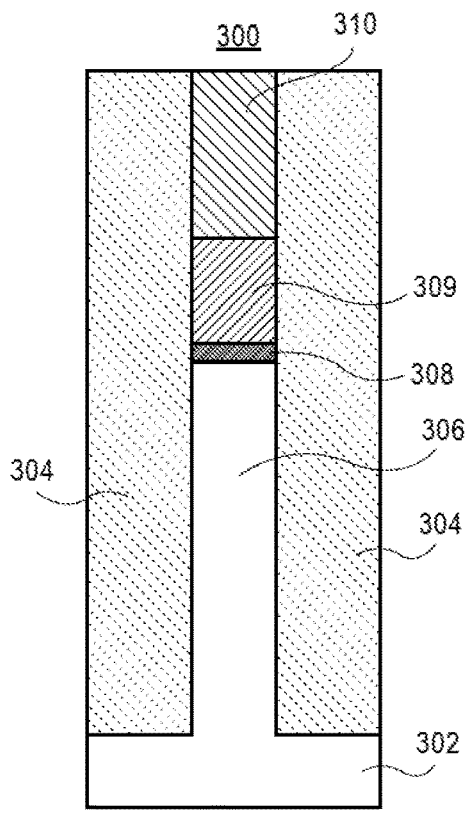
FIG. 3 illustrates a cross-sectional view of a semiconductor fin formed in trench of an isolation structure on a substrate, in accordance with an embodiment of the present disclosure.
Figure 4A:
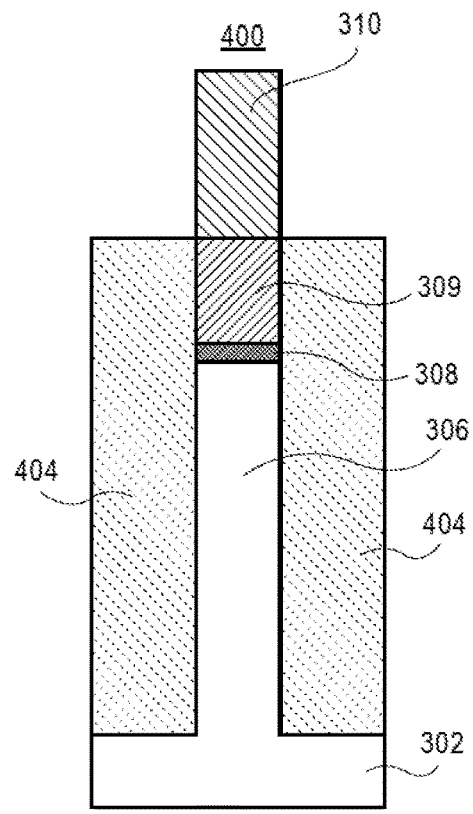
FIGS. 4A-4C illustrates cross-sectional views of the semiconductor fin with various extents of recessing of the isolation structure of FIG. 3, in accordance with an embodiment of the present disclosure.
Figure 4B:
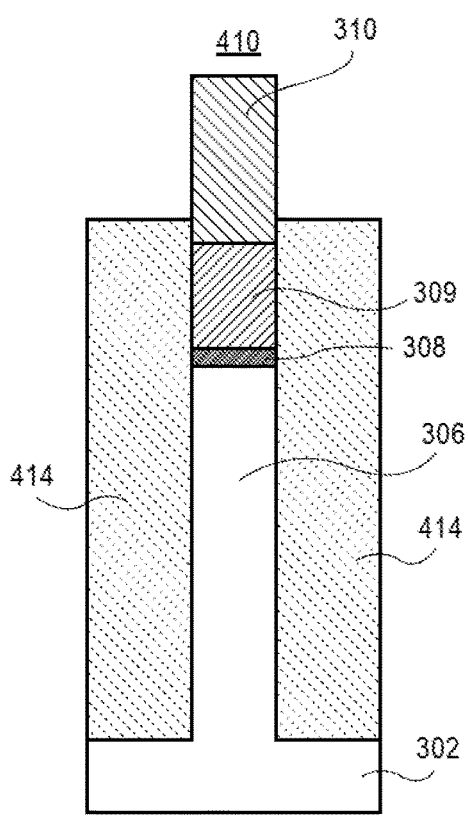
Figure 4C:
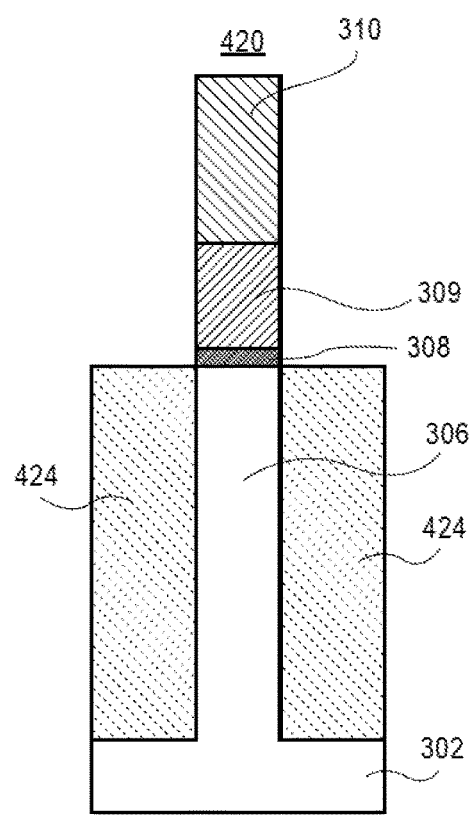

In an example involving fabrication of a Ge device or channel layer on a $Si_{1-x}Ge_x$ virtual substrate on a germanium nucleation layer, FIG. 3 illustrates a cross-sectional view of a semiconductor fin formed in trench of an isolation structure on a substrate, in accordance with an embodiment of the present disclosure. FIGS. 4A-4C illustrates cross-sectional views of the semiconductor fin with various extents of recessing of the isolation structure of FIG. 3, in accordance with an embodiment of the present disclosure.

Referring to FIG. 3, a starting structure 300 includes an ART isolation structure 304 formed on a silicon substrate 302 and has an opening exposing a portion of the silicon substrate 302. A fin is formed in the opening, e.g., by epitaxial growth, the fin having a lower silicon portion 306, an intermediate germanium portion 308 on the lower silicon portion 306, an intermediate silicon germanium portion 309 on the intermediate germanium portion 308, and an upper germanium portion 310 on the intermediate silicon germanium portion 309.

Referring to FIGS. 4A-4C, the ART isolation structure 304 is then recessed to form an isolation structure along sidewalls of the lower silicon portion 306 of the fin. In an embodiment, as shown for structure 400 in FIG. 4A, the top surface of the isolation structure 404 is co-planar with a top surface of the intermediate silicon germanium portion 309 of the fin. In another embodiment, as shown for structure 410 in FIG. 4B, the top surface of the isolation structure 414 is above a top surface of the intermediate silicon germanium portion 309 of the fin. In another embodiment, as shown for structure 420 in FIG. 4C, the top surface of the isolation structure 424 is co-planar with a bottom surface of the intermediate germanium portion 308 of the fin. In another embodiment, not shown, the top surface of the isolation structure is below a bottom surface of the intermediate germanium portion 308 of the fin. In another embodiment, not shown, the top surface of the isolation structure is co-planar with a top surface of the intermediate germanium 308 portion of the fin. In another embodiment, not shown, the top surface of the isolation structure is between the top and bottom surfaces of the intermediate silicon germanium portion 309 of the fin. In another embodiment, not shown, the top surface of the isolation structure is between the top and bottom surfaces of the intermediate germanium portion 308 of the fin. In the last such case, the intermediate germanium portion 308 of the fin may be accessible for optional removal during a replacement gate process flow to enable fabrication of a gate all around device.

In an embodiment, the intermediate germanium portion 308 of the fin has a lattice constant approximately the same as a lattice constant of the intermediate silicon germanium portion 309 of the fin. In an embodiment, the intermediate germanium portion 308 of the fin is partially relaxed and has trapped defects therein. In an embodiment, the intermediate silicon germanium portion 309 of the fin includes $Si_{30}Ge_{70}$.

In an embodiment, as is described in greater detail below and as exemplified in FIGS. 5A-5E, 6A and 6B, a gate stack is formed over a top of and along sidewalls of the upper germanium portion 310 of the fin and on a top surface of the isolation structure (such as isolation structure 404, 414 or 424). It is to be appreciated that the gate stack is formed along the sidewalls of the portion of the fin exposed by recessing of the isolation structure, which may or may not include some or all of intermediate silicon germanium portion 309, some or all of intermediate germanium portion 308 and, possibly some of lower silicon portion 306. The gate stack has a first side opposite a second side. A first source or drain structure is at the first side of the gate stack. A second source or drain structure is at the second side of the gate stack. In an embodiment, the first and second source or drain structures are first and second epitaxial source or drain structures embedded in the fin at the first and second sides of the gate stack, respectively. In another embodiment, the first and second source or drain structures are first and second doped regions formed in the fin at the first and second sides of the gate stack, respectively.

In accordance with one or more embodiments herein, more generally, the materials of a device layer and an underlying substrate are any material pairing with a large lattice mismatch. If used, a virtual substrate layer may be a material with a lattice constant intermediate to the materials of a device layer and an underlying substrate. In one or more embodiments described herein, a germanium nucleation layer is removed in at least a channel region during replacement gate processing, enabling formation of gate all around devices.

As an example of gate electrode fabrication, FIGS. 5A-5E illustrate angled three-dimensional cross-sectional views of various operations in a method of fabricating an integrated circuit structure, in accordance with an embodiment of the present disclosure.

Figure 5A:
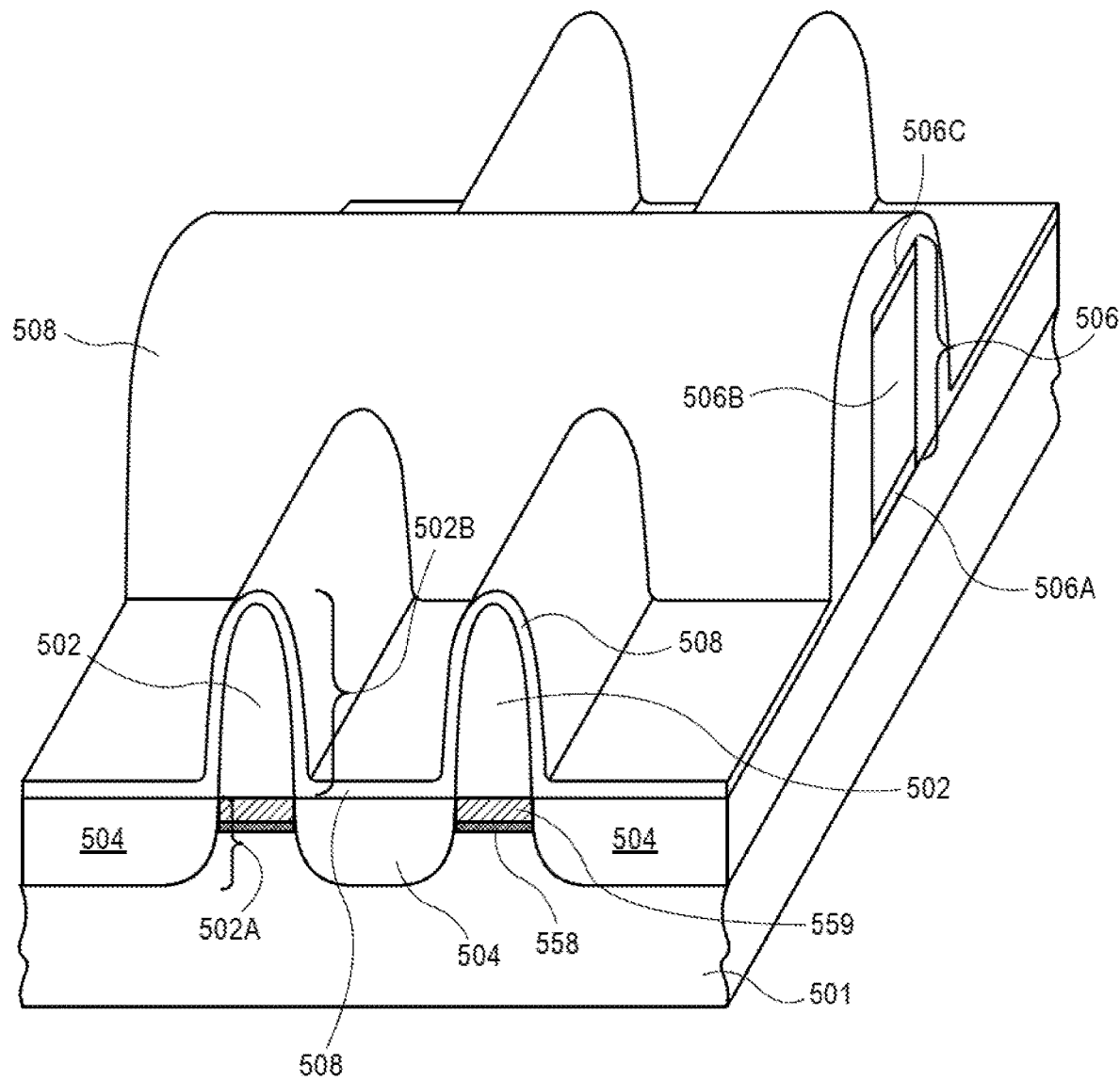
FIGS. 5A-5E illustrate angled three-dimensional cross-sectional views of various operations in a method of fabricating an integrated circuit structure, in accordance with an embodiment of the present disclosure.

Referring to FIG. 5A, a method of fabricating an integrated circuit structure includes forming one or more fins on a substrate 501, with two fins shown in FIG. 5A. The exemplary fin has a lower fin portion 502A including a germanium nucleation layer 558 (such as described above) and, possibly, a virtual substrate or intermediate silicon germanium fin portion 559. The exemplary fin also includes and an upper fin portion 502B, such as an upper silicon germanium fin portion or an upper germanium fin portion, such as described above. An insulating structure 504 is formed directly adjacent sidewalls of the lower fin portion 502A of the fin 502. A gate structure 506 is formed over the upper fin portion 502B and over the insulating structure 504. In an embodiment, the gate structure is a placeholder or dummy gate structure including a sacrificial gate dielectric layer 506A, a sacrificial gate 506B, and a hardmask 506C. A dielectric material 508 is formed conformal with the upper fin portion 502B of the fin 502, conformal with the gate structure 506, and conformal with the insulating structure 504.

Figure 5B:
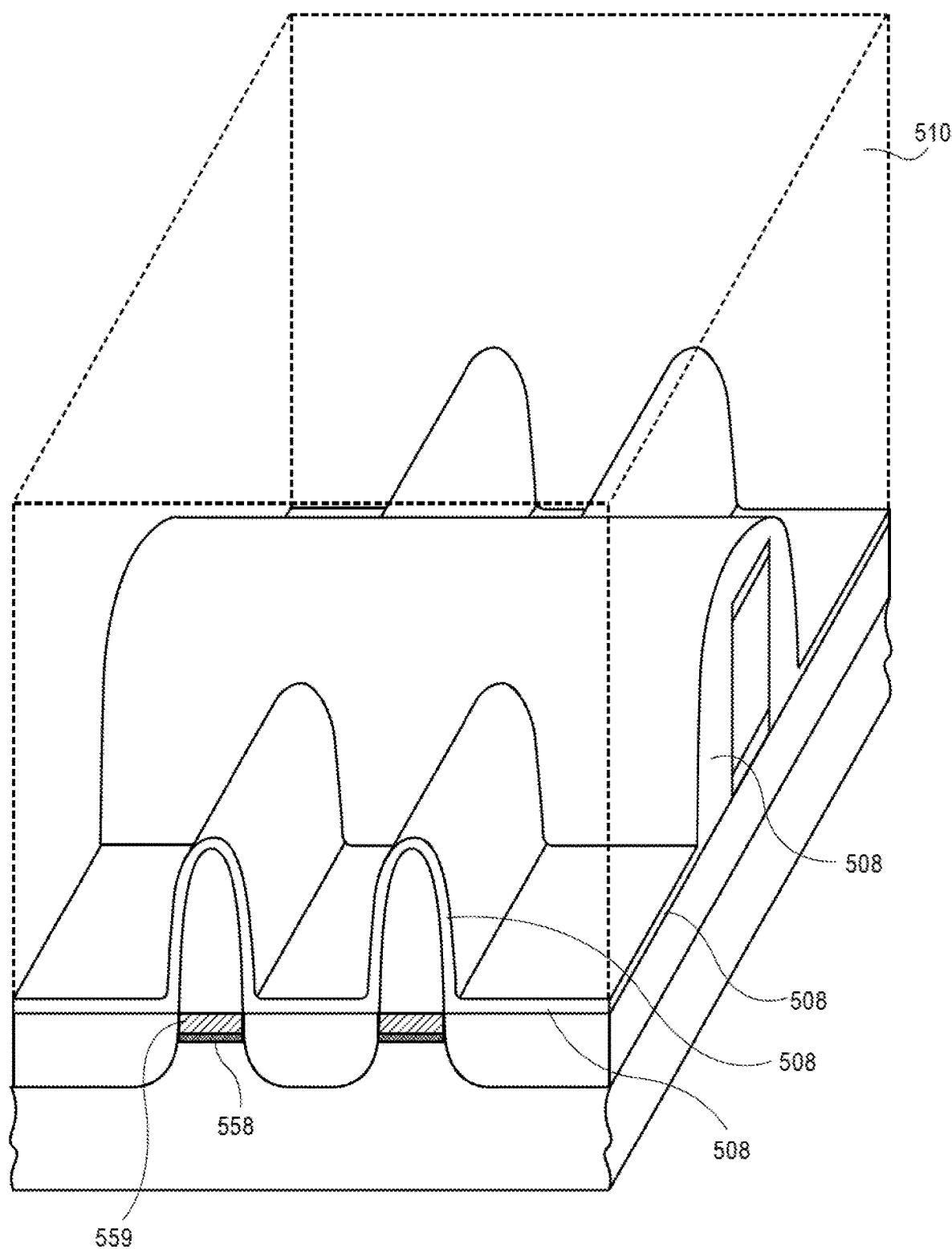

Referring to FIG. 5B, a hardmask material 510 is formed over the dielectric material 508. In an embodiment, the hardmask material 510 is a carbon-based hardmask material formed using a spin-on process.

Figure 5C:
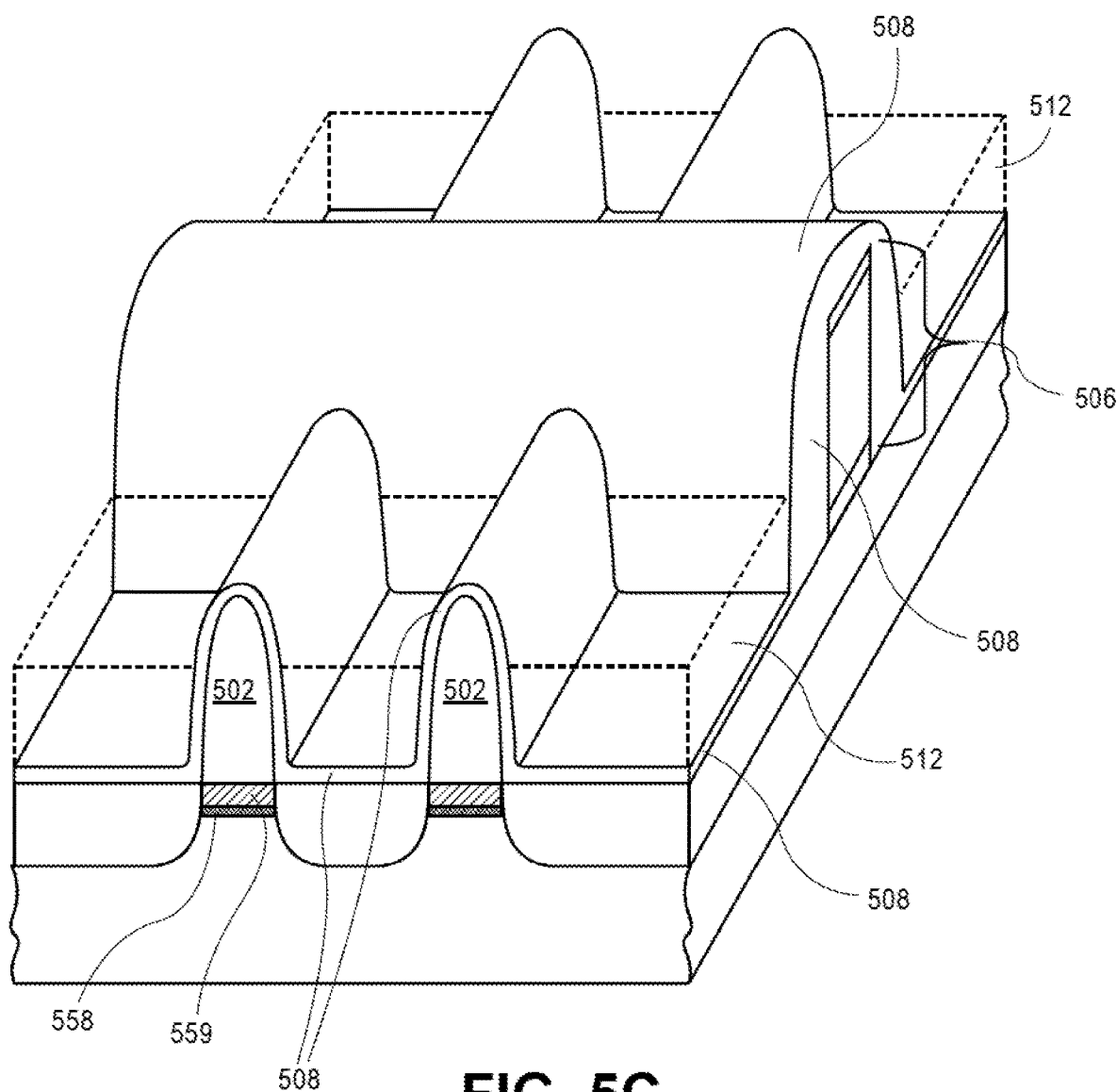

Referring to FIG. 5C, the hardmask material 510 is recessed to form a recessed hardmask material 512 and to expose a portion of the dielectric material 508 conformal with the upper fin portion 502B of the fin and conformal with the gate structure 506. The recessed hardmask material 512 covers a portion of the dielectric material 508 conformal with the insulating structure 504. In an embodiment, the hardmask material 510 is recessed using a wet etching process. In another embodiment, the hardmask material 510 is recessed using an ash, a dry etch or a plasma etch process.

Figure 5D:
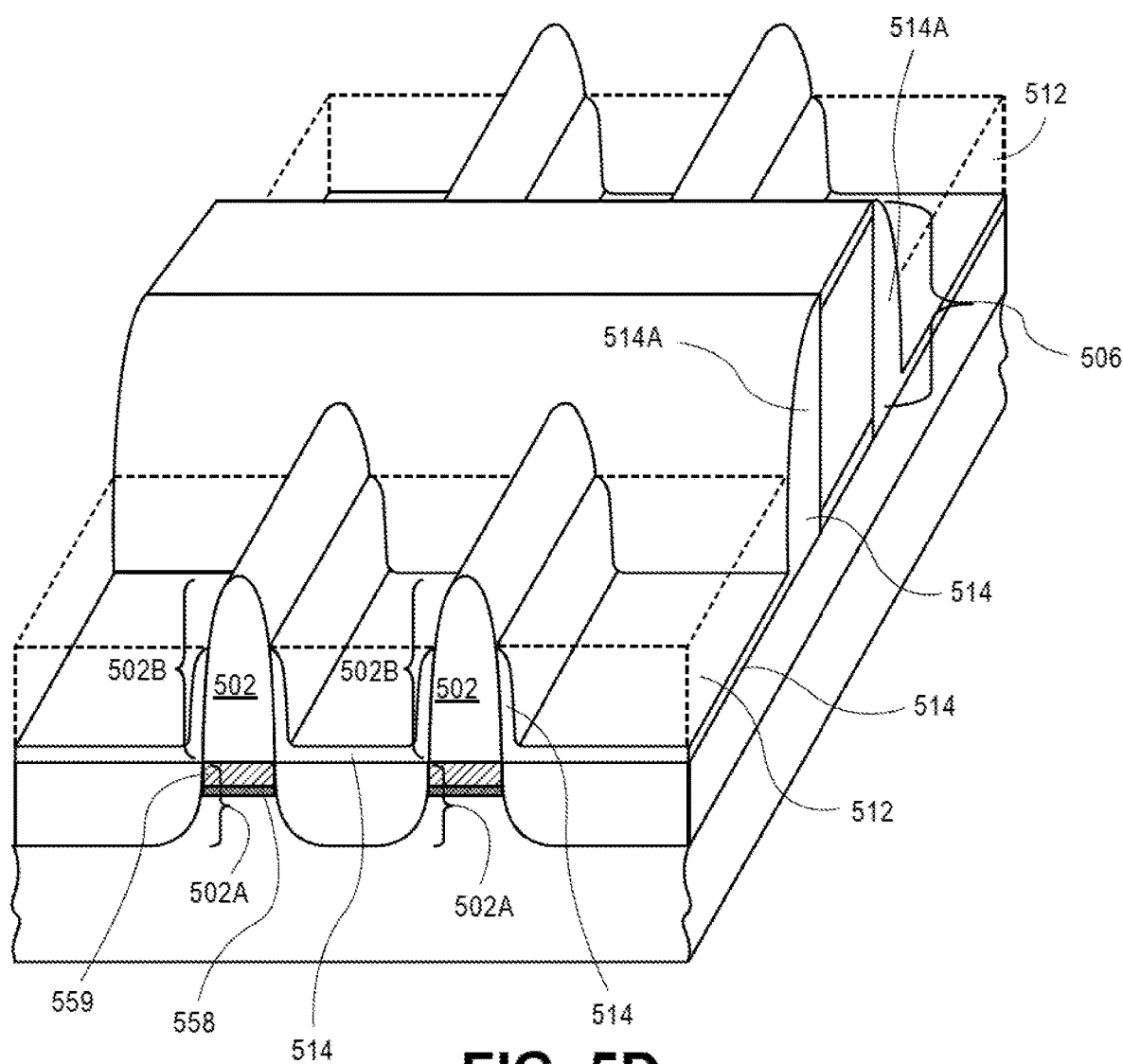

Referring to FIG. 5D, the dielectric material 508 is anisotropically etched to form a patterned dielectric material 514 along sidewalls of the gate structure 506 (as dielectric spacers 514A), along portions of the sidewalls of the upper fin portion 502B of the fin, and over the insulating structure 504.

Figure 5E:
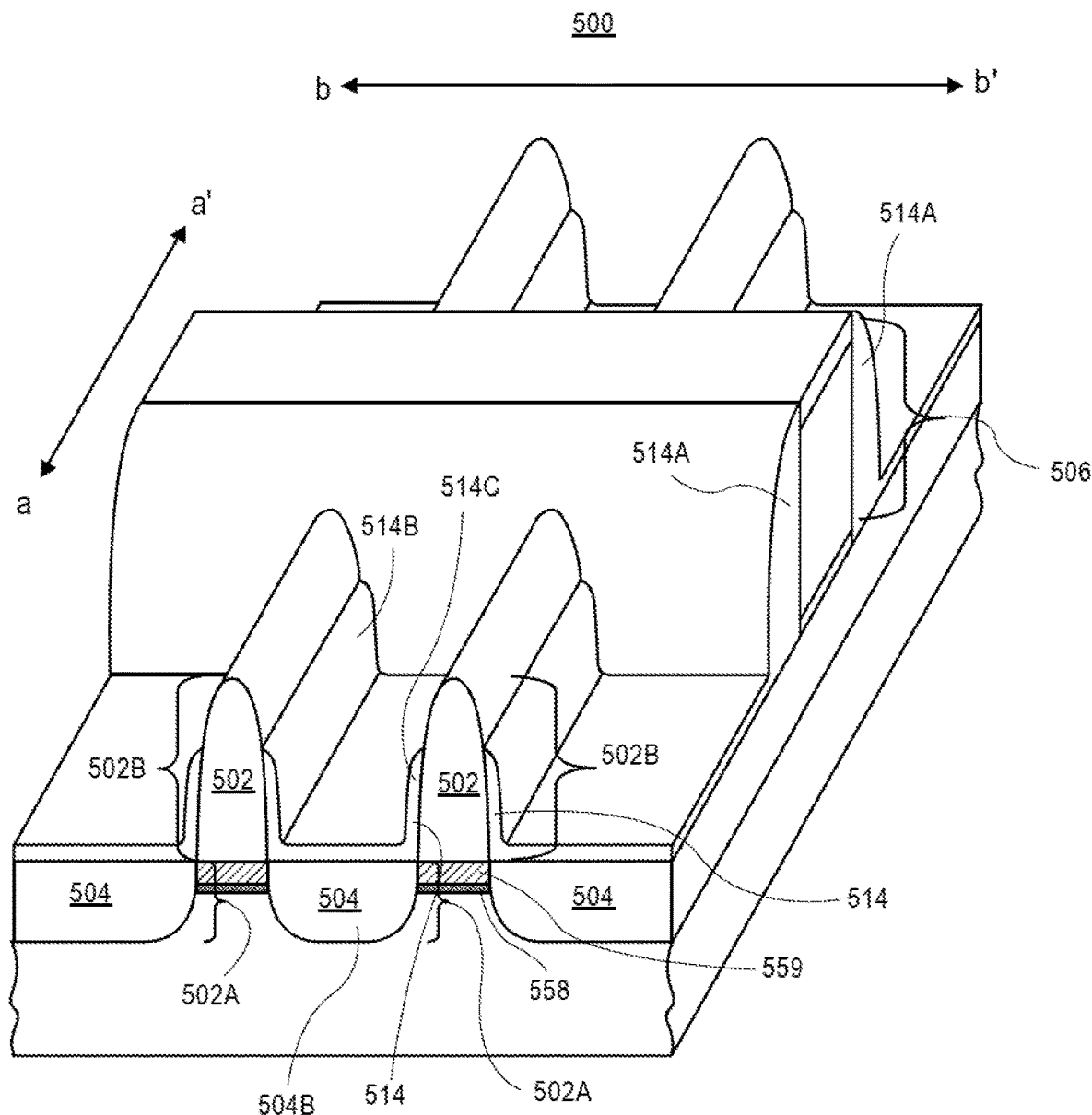

Referring to FIG. 5E, the recessed hardmask material 512 is removed from the structure of FIG. 5D. In an embodiment, the gate structure 506 is a dummy gate structure, and subsequent processing includes replacing the gate structure 506 with a permanent gate dielectric and gate electrode stack. In an embodiment, further processing includes forming embedded source or drain structures on opposing sides of the gate structure 506, as is described in greater detail below.

Referring again to FIG. 5E, in an embodiment, an integrated circuit structure 500 includes a first fin (left fin), the first fin having a lower fin portion 502A and an upper fin portion 502B. The integrated circuit structure further includes a second fin (right fin), the second fin having a lower fin portion 502A and an upper fin portion 502B. An insulating structure 504 is directly adjacent sidewalls of the lower fin portion 502A of the first fin and directly adjacent sidewalls of the lower fin portion 502A of the second fin. A gate electrode 506 is over the upper fin portion 502B of the first fin (left fin), over the upper fin portion 502B of the second fin (right fin), and over a first portion 504A of the insulating structure 504. A first dielectric spacer 514A is along a sidewall of the upper fin portion 502B of the first fin (left 7fin), and a second dielectric spacer 514C is along a sidewall of the upper fin portion 502B of the second fin (right fin). The second dielectric spacer 514C is continuous with the first dielectric spacer 514B over a second portion 504B of the insulating structure 504 between the first fin (left fin and the second fin (right fin). In an embodiment, the first and second dielectric spacers 514B and 514C include silicon and nitrogen, such as a stoichiometric $Si_3N_4$ silicon nitride material, a silicon-rich silicon nitride material, or a silicon-poor silicon nitride material.

In an embodiment, processing the integrated circuit structure 500 of FIG. 5E further includes fabrication of embedded source or drain structures on opposing sides of the gate electrode 506. In one such embodiment, such embedded source or drain structures have a bottom surface below a top surface of the first and second dielectric spacers 514B and 514C along the sidewalls of the upper fin portions 502B of the first and second fins, and the source or drain structures having a top surface above a top surface of the first and second dielectric spacers 514B and 514C along the sidewalls of the upper fin portions 502B of the first and second fins, as is described below in association with FIG. 6B.

Figure 6A:
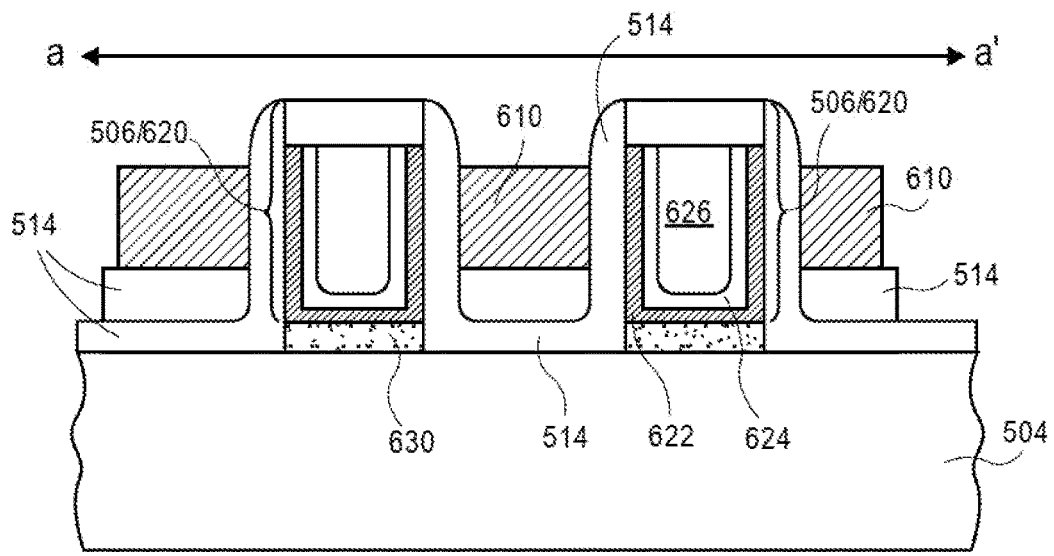
FIG. 6A illustrates a slightly projected cross-sectional view taken along the a-a' axis of FIG. 5E for an integrated circuit structure including permanent gate stacks and epitaxial source or drain regions, in accordance with an embodiment of the present disclosure.
Figure 6B:
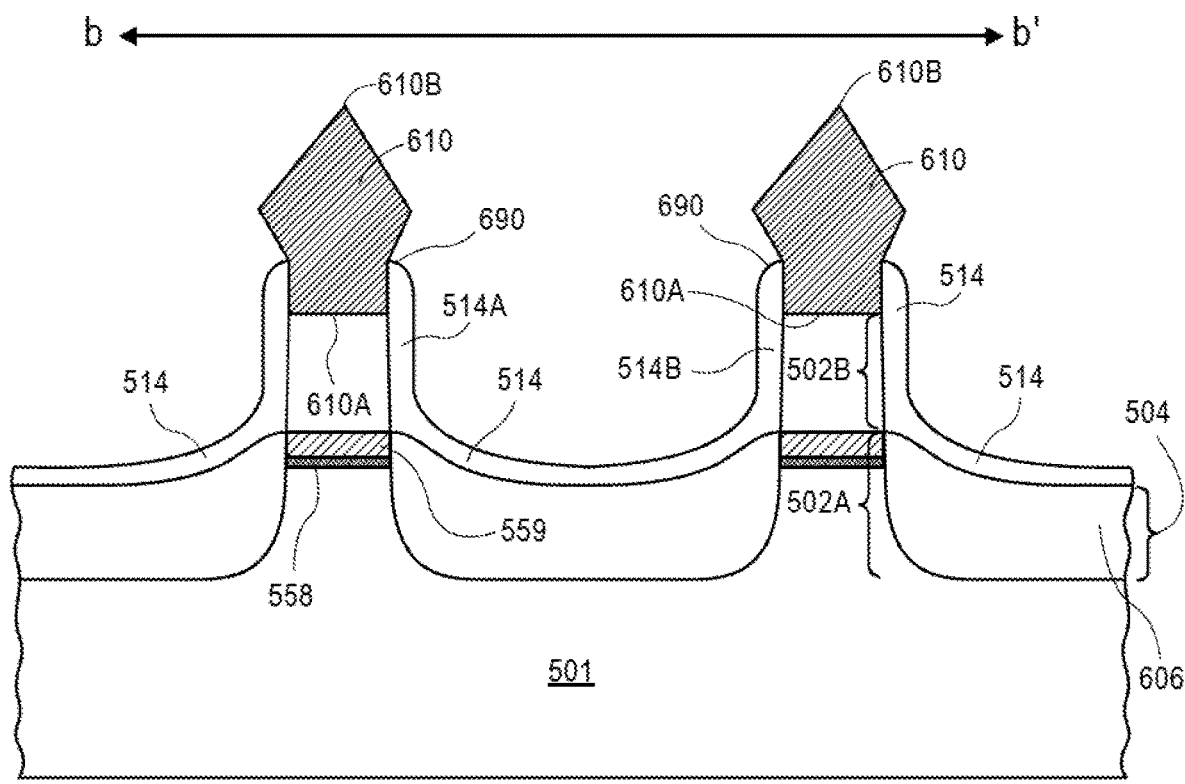
FIG. 6B illustrates a cross-sectional view taken along the b-b' axis of FIG. 5E for an integrated circuit structure including epitaxial source or drain regions, in accordance with an embodiment of the present disclosure.

FIG. 6A illustrates a slightly projected cross-sectional view taken along the a-a' axis of FIG. 5E for an integrated circuit structure including permanent gate stacks and epitaxial source or drain regions, in accordance with an embodiment of the present disclosure. FIG. 6B illustrates a cross-sectional view taken along the b-b' axis of FIG. 5E for an integrated circuit structure including epitaxial source or drain regions, in accordance with an embodiment of the present disclosure.

Referring to FIGS. 6A and 6B, in an embodiment, the integrated circuit structure includes embedded source or drain structures 610 on opposing sides of the gate electrodes 506. The embedded source or drain structures 610 have a bottom surface 610A below a top surface 690 of the first and second dielectric spacers 514B and 514C along the sidewalls of the upper fin portions 502B of the first and second fins. The embedded source or drain structures 610 have a top surface 610B above a top surface of the first and second dielectric spacers 514B and 514C along the sidewalls of the upper fin portions 502B of the first and second fins.

In an embodiment, gate stacks 506 are permanent gate stacks 620. In one such embodiment, the permanent gate stacks 620 include a gate dielectric layer 622, a first gate layer 624, such as a workfunction gate layer, and a gate fill material 626, as is depicted in FIG. 6A. In one embodiment, where the permanent gate structures 620 are over the insulating structure 504, the permanent gate structures 620 are formed on residual polycrystalline silicon portions 630, which may be remnants of a replacement gate process involving sacrificial polycrystalline silicon gate electrodes.

In an embodiment, instead of a recessed portion of an ART isolation structure 606, the insulating structure 504 is a multi-layer structure including a first insulating layer, a second insulating layer directly on the first insulating layer, and a dielectric fill material directly laterally on the second insulating layer. In one embodiment, the first insulating layer is a non-doped insulating layer including silicon and oxygen. In one embodiment, the second insulating layer includes silicon and nitrogen. In one embodiment, the dielectric fill material includes silicon and oxygen.

In another aspect, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In one or more embodiments, the gate contact structures fabricated to contact the gate electrodes are self-aligned via structures.

In an embodiment, an integrated circuit structure, semiconductor structure or device is a non-planar device such as, but not limited to, a fin-FET or a tri-gate device. In such an embodiment, a corresponding semiconducting channel region is composed of or is formed in a three-dimensional body. In one such embodiment, gate electrode stacks of gate lines surround at least a top surface and a pair of sidewalls of the three-dimensional body. In another embodiment, at least the channel region is made to be a discrete three-dimensional body, such as in a gate-all-around device. In one such embodiment, gate electrode stacks of gate lines each completely surrounds the channel region.

More generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., TILA). The additional dielectric material is included as a trench contact dielectric cap layer with etch characteristics different from the gate dielectric material cap layer already used for trench contact alignment in a gate aligned contact process (GAP) processing scheme (e.g., GILA).

In an embodiment, providing an integrated circuit structure involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at an integrated circuit structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) technology node sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

It is to be appreciated that in the above exemplary FEOL embodiments, in an embodiment, 10 nanometer or sub-10 nanometer node processing is implemented directly in to the fabrication schemes and resulting structures as a technology driver. In other embodiment, FEOL considerations may be driven by BEOL 10 nanometer or sub-10 nanometer processing requirements. For example, material selection and layouts for FEOL layers and devices may need to accommodate BEOL processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
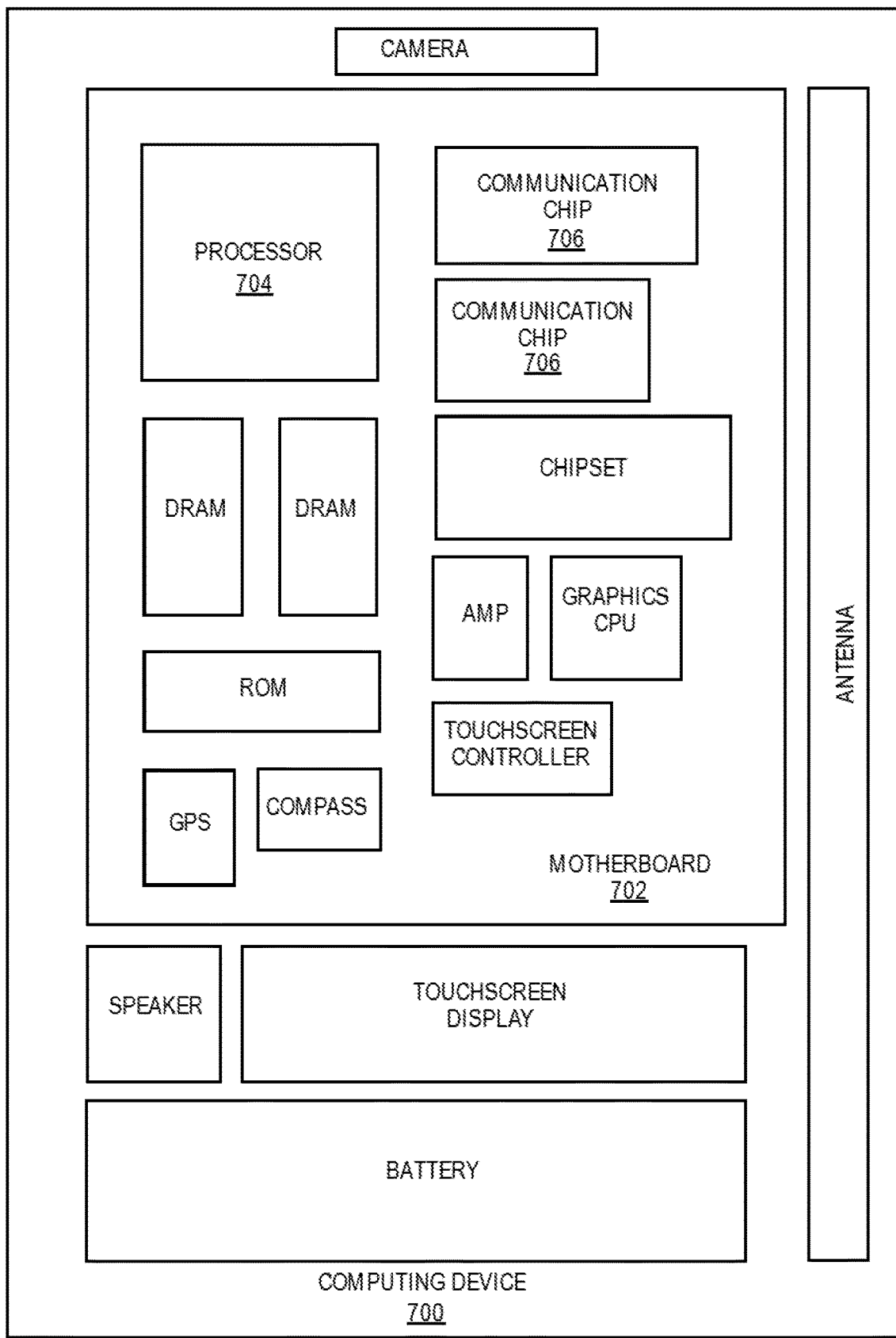
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 706 also includes an integrated circuit die packaged within the communication chip 706. In accordance with another implementation of the disclosure, the integrated circuit die of the communication chip is built in accordance with implementations of the disclosure.

In further implementations, another component housed within the computing device 700 may contain an integrated circuit die built in accordance with implementations of embodiments of the disclosure.

In various embodiments, the computing device 700 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
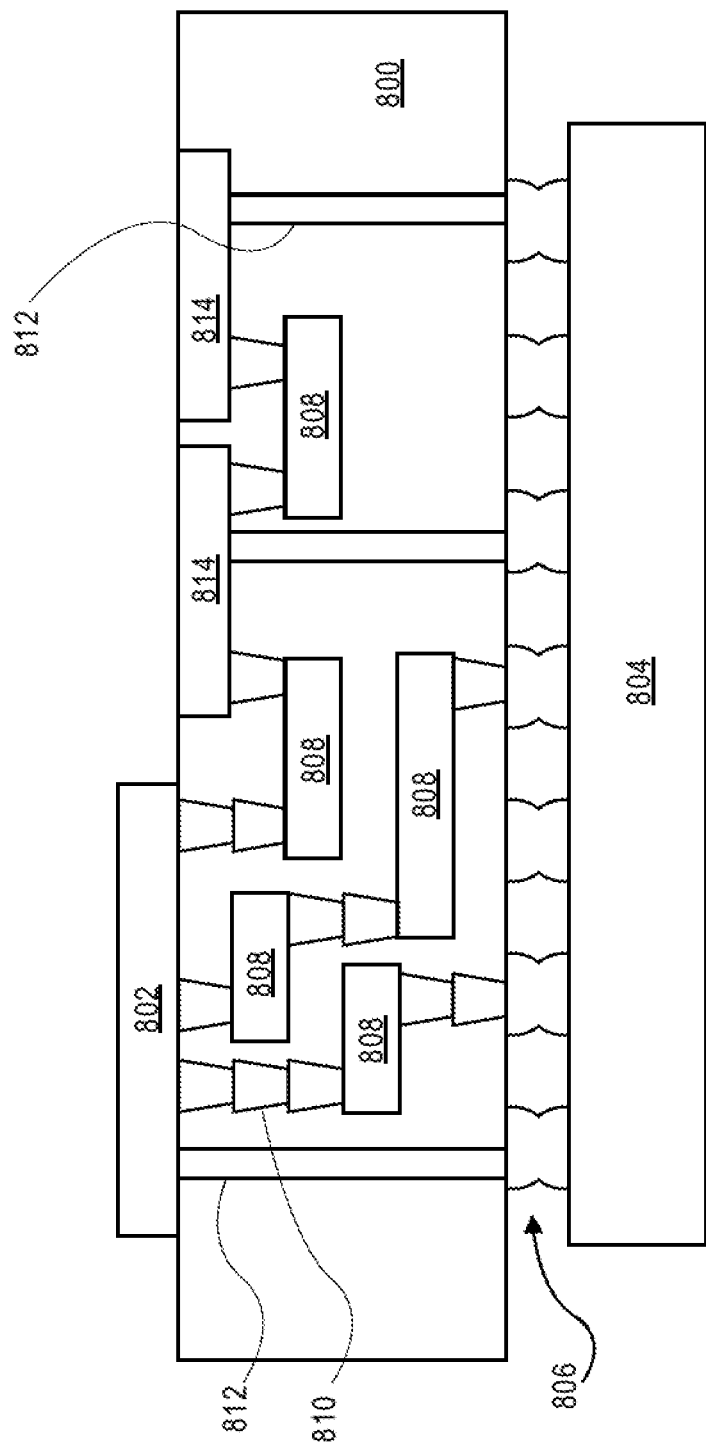
FIG. 8 illustrates an interposer that includes one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Figure 9:
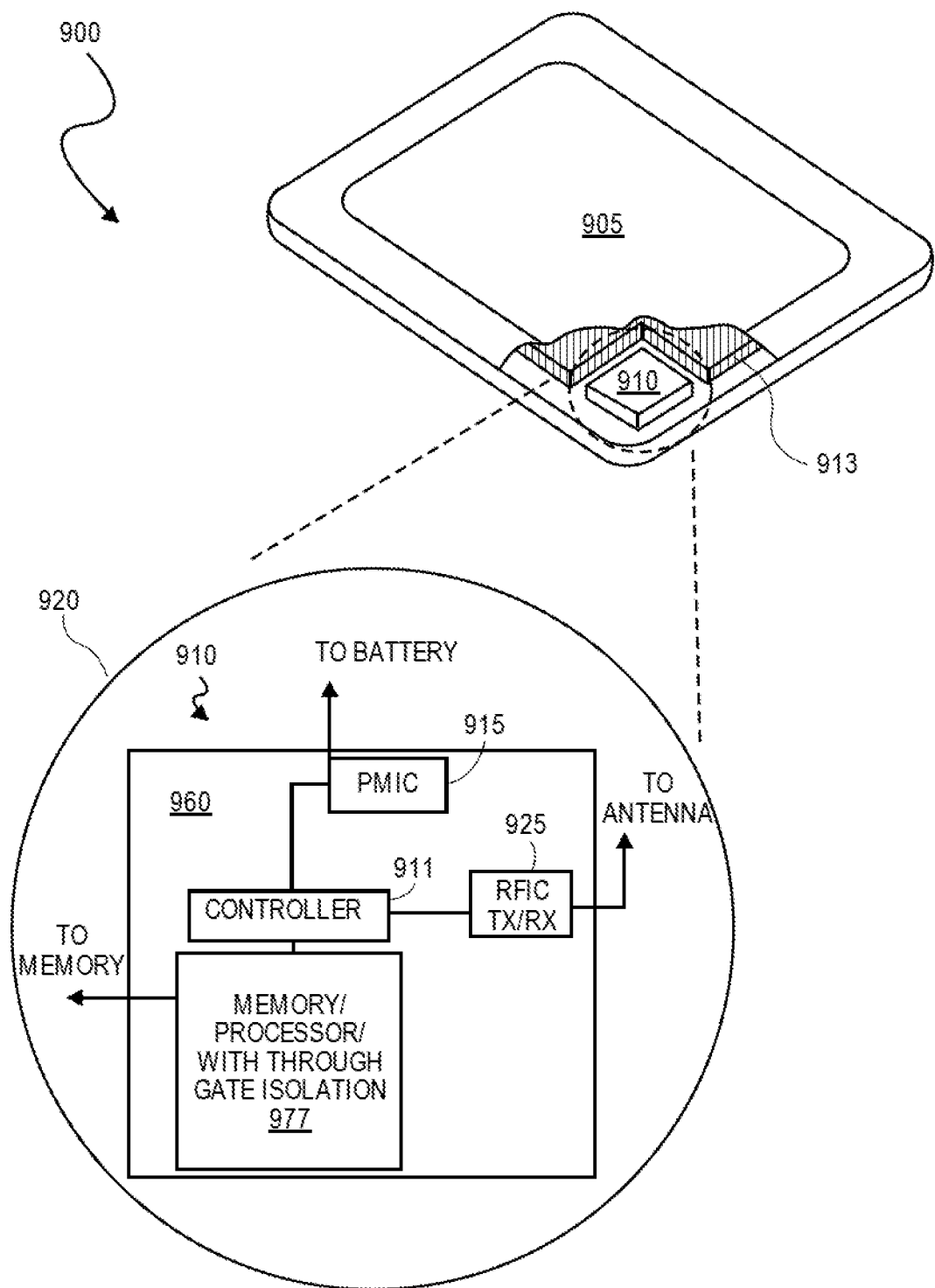
FIG. 9 is an isometric view of a mobile computing platform employing an IC fabricated according to one or more processes described herein or including one or more features described herein, in accordance with an embodiment of the present disclosure.

FIG. 9 is an isometric view of a mobile computing platform 900 employing an integrated circuit (IC) fabricated according to one or more processes described herein or including one or more features described herein, in accordance with an embodiment of the present disclosure.

The mobile computing platform 900 may be any portable device configured for each of electronic data display, electronic data processing, and wireless electronic data transmission. For example, mobile computing platform 900 may be any of a tablet, a smart phone, laptop computer, etc. and includes a display screen 905 which in the exemplary embodiment is a touchscreen (capacitive, inductive, resistive, etc.), a chip-level (SoC) or package-level integrated system 910, and a battery 913. As illustrated, the greater the level of integration in the system 910 enabled by higher transistor packing density, the greater the portion of the mobile computing platform 900 that may be occupied by the battery 913 or non-volatile storage, such as a solid state drive, or the greater the transistor gate count for improved platform functionality. Similarly, the greater the carrier mobility of each transistor in the system 910, the greater the functionality. As such, techniques described herein may enable performance and form factor improvements in the mobile computing platform 900.

The integrated system 910 is further illustrated in the expanded view 920. In the exemplary embodiment, packaged device 977 includes at least one memory chip (e.g., RAM), or at least one processor chip (e.g., a multi-core microprocessor and/or graphics processor) fabricated according to one or more processes described herein or including one or more features described herein. The packaged device 977 is further coupled to the board 960 along with one or more of a power management integrated circuit (PMIC) 915, RF (wireless) integrated circuit (RFIC) 925 including a wideband RF (wireless) transmitter and/or receiver (e.g., including a digital baseband and an analog front end module further includes a power amplifier on a transmit path and a low noise amplifier on a receive path), and a controller thereof 911. Functionally, the PMIC 915 performs battery power regulation, DC-to-DC conversion, etc., and so has an input coupled to the battery 913 and with an output providing a current supply to all the other functional modules. As further illustrated, in the exemplary embodiment, the RFIC 925 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 977 or within a single IC (SoC) coupled to the package substrate of the packaged device 977.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 10:
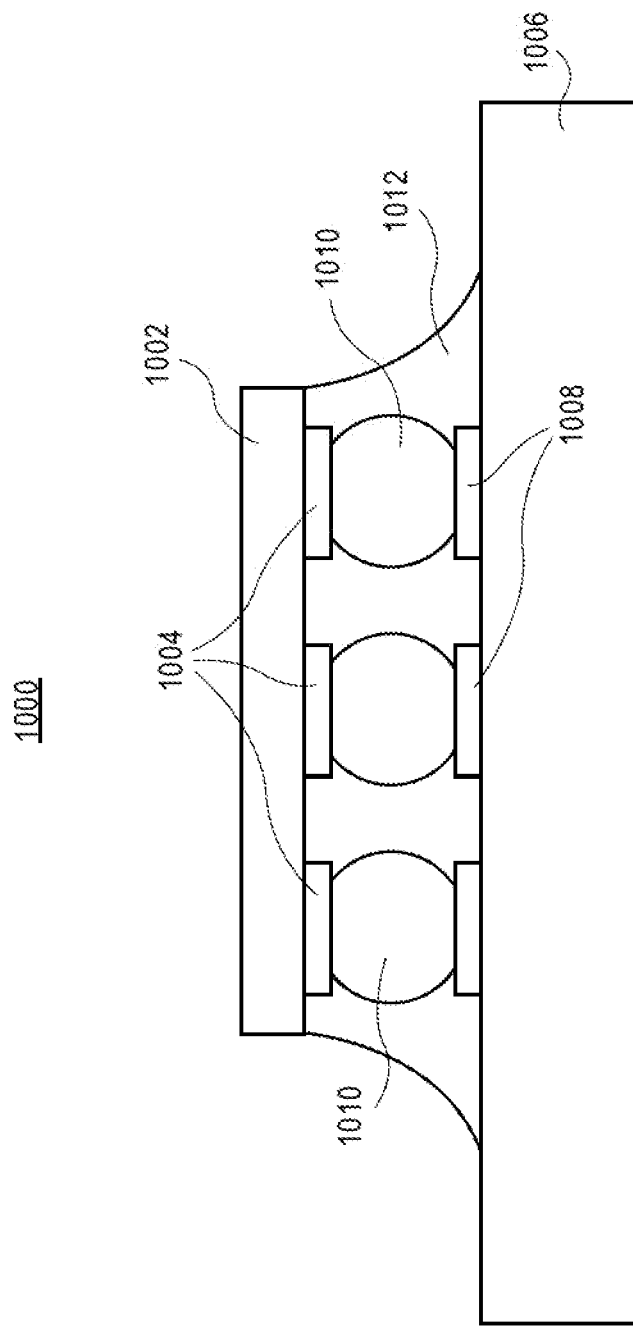
FIG. 10 illustrates a cross-sectional view of a flip-chip mounted die, in accordance with an embodiment of the present disclosure.

FIG. 10 illustrates a cross-sectional view of a flip-chip mounted die, in accordance with an embodiment of the present disclosure.

Referring to FIG. 10, an apparatus 1000 includes a die 1002 such as an integrated circuit (IC) fabricated according to one or more processes described herein or including one or more features described herein, in accordance with an embodiment of the present disclosure. The die 1002 includes metallized pads 1004 thereon. A package substrate 1006, such as a ceramic or organic substrate, includes connections 1008 thereon. The die 1002 and package substrate 1006 are electrically connected by solder balls 1010 coupled to the metallized pads 1004 and the connections 1008. An underfill material 1012 surrounds the solder balls 1010.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include integrated circuit structures having germanium-based channels.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a fin having a lower silicon portion, an intermediate germanium portion on the lower silicon portion, and an upper silicon germanium portion on the intermediate germanium portion. An isolation structure is along sidewalls of the lower silicon portion of the fin. A gate stack over a top of and along sidewalls of the upper silicon germanium portion of the fin and on a top surface of the isolation structure. The gate stack has a first side opposite a second side. A first source or drain structure is at the first side of the gate stack. A second source or drain structure is at the second side of the gate stack.

Example embodiment 2: The integrated circuit structure of example embodiment 1, wherein the top surface of the isolation structure is above a top surface of the intermediate germanium portion of the fin.

Example embodiment 3: The integrated circuit structure of example embodiment 1, wherein the top surface of the isolation structure is co-planar with a top surface of the intermediate germanium portion of the fin.

Example embodiment 4: The integrated circuit structure of example embodiment 1, wherein the top surface of the isolation structure is co-planar with a bottom surface of the intermediate germanium portion of the fin.

Example embodiment 5: The integrated circuit structure of example embodiment 1, wherein the top surface of the isolation structure is below a bottom surface of the intermediate germanium portion of the fin.

Example embodiment 6: The integrated circuit structure of example embodiment 1, 2, 3, 4 or 5, wherein the intermediate germanium portion of the fin has a lattice constant approximately the same as a lattice constant of the upper silicon germanium portion of the fin.

Example embodiment 7: The integrated circuit structure of example embodiment 1, 2, 3, 4, 5 or 6, wherein the intermediate germanium portion of the fin is partially relaxed and has trapped defects therein.

Example embodiment 8: The integrated circuit structure of example embodiment 1, 2, 3, 4, 5, 6 or 7, wherein the first and second source or drain structures are first and second epitaxial source or drain structures embedded in the fin at the first and second sides of the gate stack, respectively.

Example embodiment 9: The integrated circuit structure of example embodiment 1, 2, 3, 4, 5, 6, 7 or 8, wherein the upper silicon germanium portion of the fin includes $Si_{30}Ge_{70}$.

Example embodiment 10: An integrated circuit structure includes a fin having a lower silicon portion, an intermediate germanium portion on the lower silicon portion, an intermediate silicon germanium portion on the intermediate germanium portion, and an upper germanium portion on the intermediate silicon germanium portion. An isolation structure is along sidewalls of the lower silicon portion of the fin. A gate stack is over a top of and along sidewalls of the upper germanium portion of the fin and on a top surface of the isolation structure. The gate stack has a first side opposite a second side. A first source or drain structure is at the first side of the gate stack. A second source or drain structure is at the second side of the gate stack.

Example embodiment 11: The integrated circuit structure of example embodiment 10, wherein the top surface of the isolation structure is above a top surface of the intermediate silicon germanium portion of the fin.

Example embodiment 12: The integrated circuit structure of example embodiment 10, wherein the top surface of the isolation structure is co-planar with a top surface of the intermediate silicon germanium portion of the fin.

Example embodiment 13: The integrated circuit structure of example embodiment 10, wherein the top surface of the isolation structure is co-planar with a top surface of the intermediate germanium portion of the fin.

Example embodiment 14: The integrated circuit structure of example embodiment 10, wherein the top surface of the isolation structure is co-planar with a bottom surface of the intermediate germanium portion of the fin.

Example embodiment 15: The integrated circuit structure of example embodiment 10, wherein the top surface of the isolation structure is below a bottom surface of the intermediate germanium portion of the fin.

Example embodiment 16: The integrated circuit structure of example embodiment 10, 11, 12, 13, 14 or 15, wherein the intermediate germanium portion of the fin has a lattice constant approximately the same as a lattice constant of the intermediate silicon germanium portion of the fin.

Example embodiment 17: The integrated circuit structure of example embodiment 10, 11, 12, 13, 14, 15 or 16, wherein the intermediate germanium portion of the fin is partially relaxed and has trapped defects therein.

Example embodiment 18: The integrated circuit structure of example embodiment 10, 11, 12, 13, 14, 15, 16 or 17, wherein the first and second source or drain structures are first and second epitaxial source or drain structures embedded in the fin at the first and second sides of the gate stack, respectively.

Example embodiment 19: The integrated circuit structure of example embodiment 10, 11, 12, 13, 14, 15, 16, 17 or 18, wherein the intermediate silicon germanium portion of the fin includes $Si_{30}Ge_{70}$.

Example embodiment 20: A method of fabricating an integrated circuit structure includes forming a trench in an isolation structure on a silicon substrate, the trench exposing a portion of the silicon substrate. A lower silicon portion of a fin is formed in the trench and on the exposed portion of the silicon. An intermediate germanium portion of the fin is formed in the trench and on the lower silicon portion of the fin. A silicon germanium portion of the fin is formed in the trench and on the intermediate germanium portion of the fin. The isolation structure is recessed to expose sidewalls of a portion of the fin. A gate stack is formed on and along the exposed sidewalls of the portion of the fin.

Example embodiment 21: The method of example embodiment 20, further including, prior to recessing the isolation structure, forming an upper germanium portion of the fin in the trench and on the silicon germanium portion of the fin.

Example embodiment 22: The method of example embodiment 20 or 22, wherein the intermediate germanium portion of the fin traps lattice defects of the fin.

What is claimed is:

1. An integrated circuit structure, comprising:
a fin comprising a lower silicon portion, an intermediate germanium portion on the lower silicon portion, and an upper silicon germanium portion on the intermediate germanium portion, wherein the intermediate germanium portion has a greater atomic concentration of germanium than the upper silicon germanium portion;
an isolation structure along sidewalls of the lower silicon portion of the fin;
a gate stack over a top of and along sidewalls of the upper silicon germanium portion of the fin and on a top surface of the isolation structure, the gate stack having a first side opposite a second side;
a first source or drain structure at the first side of the gate stack; and
a second source or drain structure at the second side of the gate stack.

2. The integrated circuit structure of claim 1, wherein the top surface of the isolation structure is above a top surface of the intermediate germanium portion of the fin.

3. The integrated circuit structure of claim 1, wherein the top surface of the isolation structure is co-planar with a top surface of the intermediate germanium portion of the fin.

4. The integrated circuit structure of claim 1, wherein the top surface of the isolation structure is co-planar with a bottom surface of the intermediate germanium portion of the fin.

5. The integrated circuit structure of claim 1, wherein the top surface of the isolation structure is below a bottom surface of the intermediate germanium portion of the fin.

6. The integrated circuit structure of claim 1, wherein the intermediate germanium portion of the fin has a lattice constant approximately the same as a lattice constant of the upper silicon germanium portion of the fin.

7. The integrated circuit structure of claim 1, wherein the intermediate germanium portion of the fin is partially relaxed and has trapped defects therein.

8. The integrated circuit structure of claim 1, wherein the first and second source or drain structures are first and second epitaxial source or drain structures embedded in the fin at the first and second sides of the gate stack, respectively.

9. The integrated circuit structure of claim 1, wherein the upper silicon germanium portion of the fin comprises $Si_{30}Ge_{70}$.

10. An integrated circuit structure, comprising:
a fin comprising a lower silicon portion, an intermediate germanium portion on the lower silicon portion, an intermediate silicon germanium portion on the intermediate germanium portion, and an upper germanium portion on the intermediate silicon germanium portion;
an isolation structure along sidewalls of the lower silicon portion of the fin;
a gate stack over a top of and along sidewalls of the upper germanium portion of the fin and on a top surface of the isolation structure, the gate stack having a first side opposite a second side;
a first source or drain structure at the first side of the gate stack; and
a second source or drain structure at the second side of the gate stack.

11. The integrated circuit structure of claim 10, wherein the top surface of the isolation structure is above a top surface of the intermediate silicon germanium portion of the fin.

12. The integrated circuit structure of claim 10, wherein the top surface of the isolation structure is co-planar with a top surface of the intermediate silicon germanium portion of the fin.

13. The integrated circuit structure of claim 10, wherein the top surface of the isolation structure is co-planar with a top surface of the intermediate germanium portion of the fin.

14. The integrated circuit structure of claim 10, wherein the top surface of the isolation structure is co-planar with a bottom surface of the intermediate germanium portion of the fin.

15. The integrated circuit structure of claim 10, wherein the top surface of the isolation structure is below a bottom surface of the intermediate germanium portion of the fin.

16. The integrated circuit structure of claim 10, wherein the intermediate germanium portion of the fin has a lattice constant approximately the same as a lattice constant of the intermediate silicon germanium portion of the fin.

17. The integrated circuit structure of claim 10, wherein the intermediate germanium portion of the fin is partially relaxed and has trapped defects therein.

18. The integrated circuit structure of claim 10, wherein the first and second source or drain structures are first and second epitaxial source or drain structures embedded in the fin at the first and second sides of the gate stack, respectively.

19. The integrated circuit structure of claim 10, wherein the intermediate silicon germanium portion of the fin comprises $Si_{30}Ge_{70}$.

20. An integrated circuit structure, comprising:
a fin comprising a lower silicon portion, an intermediate germanium portion on the lower silicon portion, and an upper silicon germanium portion on the intermediate germanium portion, wherein the intermediate germanium portion of the fin has a lattice constant approximately the same as a lattice constant of the upper silicon germanium portion of the fin;
an isolation structure along sidewalls of the lower silicon portion of the fin;
a gate stack over a top of and along sidewalls of the upper silicon germanium portion of the fin and on a top surface of the isolation structure, the gate stack having a first side opposite a second side;
a first source or drain structure at the first side of the gate stack; and a second source or drain structure at the second side of the gate stack.

\* \* \* \* \*